United States Patent
Hirobe et al.

(10) Patent No.: US 8,577,636 B2
(45) Date of Patent: Nov. 5, 2013

(54) AZIMUTH CALCULATION PROGRAM AND ELECTRONIC COMPASS

(75) Inventors: Kisei Hirobe, Niigata-ken (JP);
Yukimitsu Yamada, Niigata-ken (JP);
Katsuyuki Kawarda, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 442 days.

(21) Appl. No.: 12/539,212

(22) Filed: Aug. 11, 2009

(65) Prior Publication Data

US 2009/0293295 A1 Dec. 3, 2009

Related U.S. Application Data

(63) Continuation of application No. PCT/JP2008/053914, filed on Mar. 5, 2008.

(30) Foreign Application Priority Data

Mar. 6, 2007 (JP) ................................. 2007-055977
Jul. 23, 2007 (JP) ................................. 2007-191164

(51) Int. Cl.
*G01C 17/38* (2006.01)
*G01C 17/00* (2006.01)

(52) U.S. Cl.
USPC ............... 702/92; 702/94; 702/152; 702/153; 33/355 R (58) Field of Classification Search
USPC ..................................... 702/92, 93, 150, 151
See application file for complete search history.

(56) References Cited

U.S. PATENT DOCUMENTS

| 7,421,792 | B2 * | 9/2008 | Kwon et al. ..................... 33/356 |
| 7,613,581 | B2 * | 11/2009 | Skvortsov et al. ............. 702/92 |
| 2003/0167121 | A1 | 9/2003 | Ockerse et al. |
| 2004/0172838 | A1 * | 9/2004 | Satoh et al. ..................... 33/316 |
| 2004/0236510 | A1 | 11/2004 | Ockerse et al. |
| 2004/0254727 | A1 | 12/2004 | Ockerse et al. |
| 2006/0031014 | A1 * | 2/2006 | Sato et al. ..................... 701/224 |
| 2006/0190174 | A1 * | 8/2006 | Li et al. ......................... 701/224 |
| 2007/0123076 | A1 | 5/2007 | Sabo et al. |

FOREIGN PATENT DOCUMENTS

| JP | 5-34156 | 2/1993 |
| JP | 2004-309228 | 11/2004 |
| JP | 2005-61969 | 3/2005 |
| JP | 2005-195410 | 7/2005 |
| JP | 2006-226810 | 8/2006 |

OTHER PUBLICATIONS

Office Action issued in corresponding Japanese Patent Application No. 2009-503985; mailed Apr. 6, 2010.
Communication issued in corresponding European Patent Application No. 08721334.4, mailed Aug. 31, 2012.

* cited by examiner

*Primary Examiner* — Mischita Henson
(74) *Attorney, Agent, or Firm* — Brinks Hofer Gilson & Lione (57) ABSTRACT

An azimuth calculation program is a computer-executable program that performs an azimuth calculation using output of a magnetic sensor. The azimuth calculation program includes a first step of generating one triangle in three-dimensional space using three output values of a magnetic sensor unit, a second step of determining a circumcircle of the triangle, and a third step of performing an azimuth calculation using center coordinates of the circumcircle and output values of the magnetic sensor.

5 Claims, 7 Drawing Sheets

| BUFFER 1 | | | BUFFER 2 | | | BUFFER 3 | | | BUFFER 4 | | | BUFFER 5 | | |
|---|---|---|---|---|---|---|---|---|---|---|---|---|---|---|
| $P_{A1}$ | | | $P_{A2}$ | | | $P_{A3}$ | | | $P_{A4}$ | | | $P_{A5}$ | | |

FIG. 8B

| BUFFER 1 | | | BUFFER 2 | | | BUFFER 3 | | | BUFFER 4 | | | BUFFER 5 | | |
|---|---|---|---|---|---|---|---|---|---|---|---|---|---|---|
| $P_{A1}$ | $P_{B1}$ | | $P_{A2}$ | | | $P_{A3}$ | | | $P_{A4}$ | | | $P_{A5}$ | | |

FIG. 8C

| BUFFER 1 | | | BUFFER 2 | | | BUFFER 3 | | | BUFFER 4 | | | BUFFER 5 | | |
|---|---|---|---|---|---|---|---|---|---|---|---|---|---|---|
| $P_{A1}$ | $P_{B1}$ | $P_{C1}$ | $P_{A2}$ | $P_{B2}$ | $P_{C2}$ | $P_{A3}$ | $P_{B3}$ | $P_{C3}$ | $P_{A4}$ | $P_{B4}$ | $P_{C4}$ | $P_{A5}$ | $P_{B5}$ | $P_{C5}$ |

AZIMUTH CALCULATION PROGRAM AND ELECTRONIC COMPASS

CLAIM OF PRIORITY

This application is a continuation of PCT/JP2008/053914, filed on Mar. 5, 2008, which claims benefit of the Japanese Patent Application No. 2007-055977 filed on Mar. 6, 2007 and No. 2007-191164 filed on Jul. 23, 2007. The contents of the above applications are hereby incorporated by reference.

BACKGROUND OF THE INVENTION

1. Field of the Invention

The present invention relates to an azimuth calculation program that performs an azimuth calculation using output of a magnetic sensor, and also to an electronic compass including the azimuth calculation program.

2. Description of the Related Art

An electronic compass is a device that calculates an azimuth angle from a reference direction using output of a magnetic sensor. In recent years, mobile terminals, such as mobile phones, including such an electronic compass have been developed. Japanese Unexamined Patent Application Publication No. 2004-309228 discloses a method with which an azimuth calculation can be performed in such a mobile terminal, regardless of the place of measurement. In the method disclosed in Japanese Unexamined Patent Application Publication No. 2004-309228, an output value of a magnetic sensor is obtained repeatedly a predetermined number of times or more, so that a circle where the resulting plurality of output values are located is used to perform an azimuth calculation.

However, in the method disclosed in Japanese Unexamined Patent Application Publication No. 2004-309228, since an output value of the magnetic sensor is obtained repeatedly a predetermined number of times or more, a long time is required for the azimuth calculation. Moreover, when an inclination direction of the mobile terminal changes, for example, when the azimuth of the mobile terminal changes while the inclination direction thereof changes, the azimuth calculation cannot be accurately performed with the method described above.

SUMMARY OF THE INVENTION

The present invention has been made in view of the points described above. The present invention provides an azimuth calculation program and an electronic compass that performs an azimuth calculation in a short time even when the inclination direction of the equipment changes.

An azimuth calculation program according to a first aspect of the present invention is a computer-executable program that performs an azimuth calculation using output of a magnetic sensor. The azimuth calculation program includes the steps of generating one triangle in three-dimensional space using three output values of the magnetic sensor, determining a circumcircle of the triangle, which is a circle that passes through the three corner points of the triangle, and performing an azimuth calculation using center coordinates of the circumcircle and output values of the magnetic sensor.

With this configuration, it is possible to perform an azimuth calculation using three output values of the magnetic sensor, and thus the azimuth of the equipment can be determined quickly. Moreover, even when the inclination direction of the equipment changes, the present program can instantaneously perform an azimuth calculation using the latest output values of the magnetic sensor. Therefore, an accurate azimuth can be obtained even when the inclination direction of the equipment suddenly changes.

In the azimuth calculation program according to the first aspect of the present invention, when an angle between a plane containing an already determined circumcircle and a plane containing a newly determined circumcircle is within a predetermined range, center coordinates of the already determined circumcircle may be preferably used to perform the azimuth calculation.

In the azimuth calculation program according to the first aspect of the present invention, when an angle between a plane containing an already determined circumcircle and a plane containing a newly determined circumcircle is within a predetermined range, center coordinates of the newly determined circumcircle may be preferably used to obtain a weighted average of center coordinates of the already determined circumcircle.

In the azimuth calculation program according to the first aspect of the present invention, the circumcircle may be preferably determined by collecting multiple sets of the three output values, and averaging centers of virtual circumcircles determined from the respective sets of the three output values.

An electronic compass according to a second aspect of the present invention includes a compass module having a magnetic sensor, and control means having the azimuth calculation program that performs an azimuth calculation using output of the magnetic sensor.

In the electronic compass according to the second aspect of the present invention, the control means may preferably include a plurality of buffers that store the three output values, and may preferably determine, on the basis of a predetermined condition, whether the output of the magnetic sensor can be stored in the plurality of buffers.

The azimuth calculation program according to the first aspect of the present invention generates one triangle in three-dimensional space using three output values of the magnetic sensor, determines a circumcircle of the triangle, and performs an azimuth calculation using center coordinates of the circumcircle and output values of the magnetic sensor. Thus, even when the inclination direction of the mobile terminal changes, an azimuth calculation can be performed in a short time.

DESCRIPTION OF THE PREFERRED EMBODIMENTS

Hereinafter, embodiments of the present invention will be described in detail with reference to the attached drawings.

Figure 1:
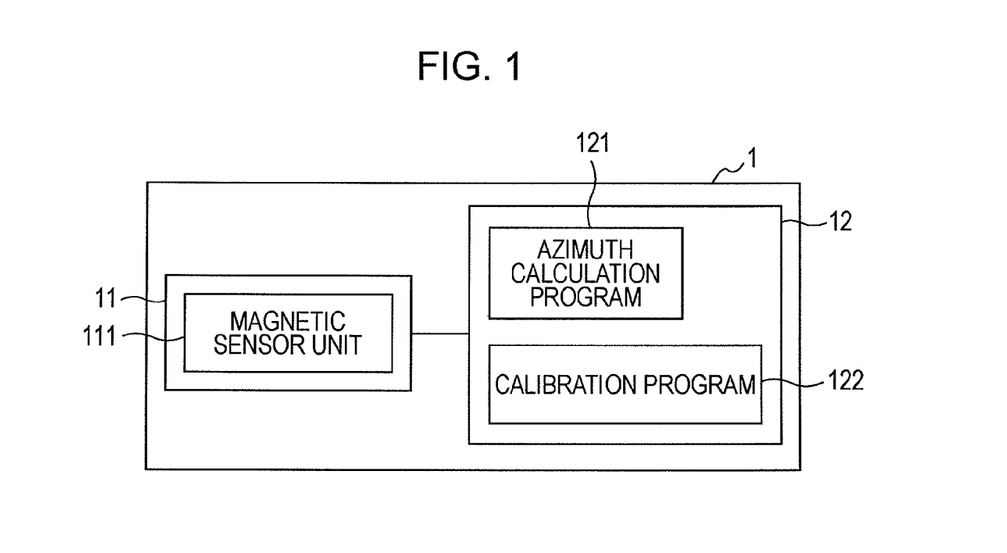
FIG. 1 is a block diagram illustrating a schematic configuration of an electronic compass according to an embodiment of the present invention.

FIG. 1 is a block diagram illustrating a schematic configuration of an electronic compass according to an embodiment of the present invention. An electronic compass 1 illustrated in FIG. 1 primarily includes a compass module 11 and a control unit 12. The compass module 11 includes a magnetic sensor unit 111. The control unit 12 includes an azimuth calculation program 121 that determines an azimuth using output of the magnetic sensor unit 111, and a calibration program 122 that determines reference points of output of a magnetic sensor using the output of the magnetic sensor unit 111.

The magnetic sensor in the magnetic sensor unit 111 of the compass module 11 corresponds to at least three axes for magnetic detection purposes. The types of sensor elements included in the magnetic sensor are not particularly limited. Examples of the sensor elements include magnetoresistive effect elements, such as a Giant MagnetoResistive (GMR) element, an Anisotropic MagnetoResistive (AMR) element, a Tunnel MagnetoResistive (TMR) element, and a Granular In Gap (GIG) element; and magnetic detection elements, such as a hall element. The compass module 11 includes a processing unit for applying a voltage and a magnetic field to the magnetic sensor unit 111, and a processing unit for converting an analog signal from the magnetic sensor unit 111 into a digital signal.

As driver software programs that drive the compass module 11, the control unit 12 includes at least the azimuth calculation program 121 and the calibration program 122. The calibration program 122 is not limited to a particular one, as long as it is adapted to determine reference points of the output of the magnetic sensor.

The azimuth calculation program 121 is a program that determines an azimuth using output of the magnetic sensor. Since the present program performs an azimuth calculation with a small number of output values, the azimuth can be determined quickly. Additionally, the present program can perform an accurate azimuth calculation even when the inclination direction changes.

The azimuth calculation program 121 is a computer-executable program that performs an azimuth calculation using output of the magnetic sensor. The azimuth calculation program 121 includes a first step of generating one triangle in three-dimensional space using three output values of the magnetic sensor, a second step of determining a circumcircle of the triangle, and a third step of performing an azimuth calculation using center coordinates of the circumcircle and output values of the magnetic sensor.

Figure 2:
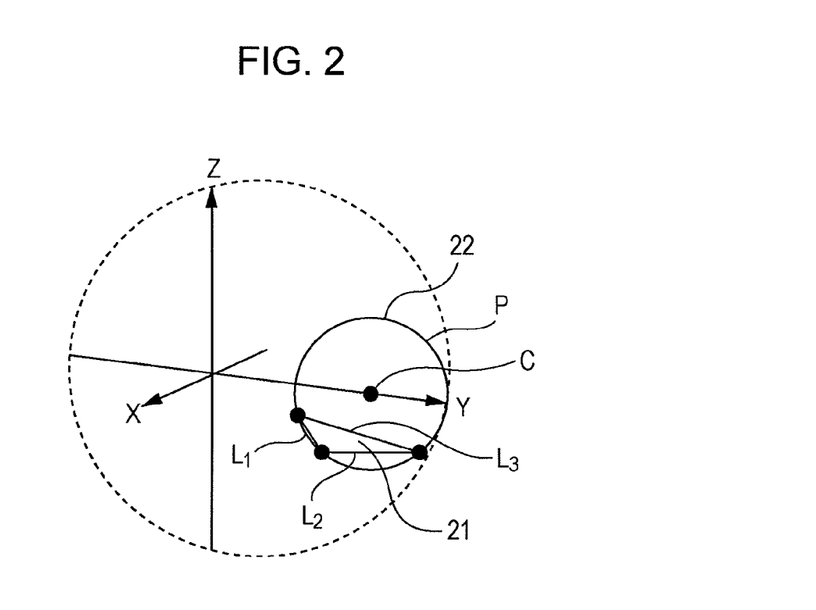
FIG. 2 illustrates principles of an azimuth calculation according to an embodiment of the present invention.

FIG. 2 illustrates principles of an azimuth calculation according to an embodiment of the present invention.

The first step determines magnetic sensor output in three-dimensional space, as illustrated in FIG. 2. The magnetic sensor output is detected data detected in the magnetic sensor unit 111 of equipment on which the compass module 11 is mounted by the user. Three points of detected data are required to form a triangle described below. The three points of detected data are determined by the magnetic sensor unit 111 and used to generate a triangle 21.

In this case, it is preferable to enhance accuracy of the azimuth calculation by evaluating probability of the triangle 21. When the azimuth calculation is performed, various factors may cause noise in the output of the magnetic sensor unit 111. If output values affected by noise are used to generate the triangle 21, the resulting triangle 21 is inaccurate. To eliminate the triangle 21 generated using output values affected by noise, the probability of the triangle 21 is evaluated. Thus, the azimuth calculation can be performed with high accuracy. Specifically, the evaluation is made by determining whether lengths $L_1$, $L_2$, and $L_3$ of respective sides of the triangle 21 exceed a predetermined value. Here, the predetermined value can be determined by parameters initialized by calibration. Examples of the parameters include a distance between reference points in three-dimensional space (i.e., a length of each side of the triangle) and the number of sampled triangles. A minimum value of the lengths in each side of the sampled triangles is used as a predetermined value. Additionally, a determination may be made as to whether the length of each side is greater than or equal to a predetermined rate (N %) of a radius of a reference sphere P to evaluate the probability of the triangle. The probability of the triangle may be evaluated on the basis of whether the distance between the center point of the reference sphere P and each vertex of the triangle 21 is substantially equal to the radius of the reference sphere P. Alternatively, the probability of the triangle may be evaluated in a simple manner by determining whether the center of the circumcircle of the triangle is located inside the reference sphere P or whether the distance between a plane containing the triangle and the center point of the reference sphere P is within the radius of the reference sphere P.

The second step determines the circumcircle 22 of the triangle 21, as illustrated in FIG. 2. This is to obtain a cross section of the reference sphere P in FIG. 2. Then, the center coordinates of the resulting circumcircle 22 are determined. The center coordinates are used to perform an azimuth calculation.

To determine the circumcircle 22 in the second step, a determination is made as to whether the center coordinates of the circumcircle 22 are located within a predetermined range. When the center coordinates are located within the predetermined range, the determination of the circumcircle 22 is confirmed. The predetermined range can be set using parameters initialized by calibration. This increases the accuracy of the circumcircle and makes it possible to perform an accurate azimuth calculation.

Information about the circumcircle 22 (e.g., output values for forming the triangle 21 to determine the circumcircle 22, and center coordinates of the circumcircle 22) is stored in a memory. The information about this already determined circumcircle and information about a newly determined circumcircle can be used to enhance accuracy of the circumcircle 22. For example, if an angle between a plane containing an already determined circumcircle and a plane containing a newly determined circumcircle is within a predetermined range, the center coordinates of the already determined circumcircle may be used to perform an azimuth calculation. If this angle is outside the predetermined range and the triangle 21 is determined not to be probable, it is determined that there is some effect of noise. Then, again, the center coordinates of the already determined circumcircle, the center coordinates being stored in the memory, are used to perform an azimuth calculation. If the above-described angle is within the predetermined range and the triangle 21 is determined to be probable, it is determined that there is a sudden change in inclination direction. Then, the center coordinates of the newly determined circumcircle are used to perform an azimuth calculation. Thus, even when the inclination direction of the equipment including the electronic compass suddenly changes, an azimuth calculation can be performed using the newly determined circumcircle. Therefore, it is possible to quickly respond to a change in inclination direction.

When the angle between the plane containing the already determined circumcircle and the plane containing the newly determined circumcircle is within the predetermined range, the center coordinates of the newly determined circumcircle may be used to obtain a weighted average of the center coordinates of the already determined circumcircle. Thus, by obtaining a weighted average using information about the newly determined circumcircle, it is possible to enhance accuracy of the circumcircle and perform an accurate azimuth calculation.

The third step performs an azimuth calculation using center coordinates C of the circumcircle 22 illustrated in FIG. 2 and output values of the magnetic sensor unit 111.

In the calibration program according to the present invention, three points are collected to generate a triangle. A condition considered in the method of collecting the three points is that a distance between points is greater than or equal to a predetermined value.

Figure 3:
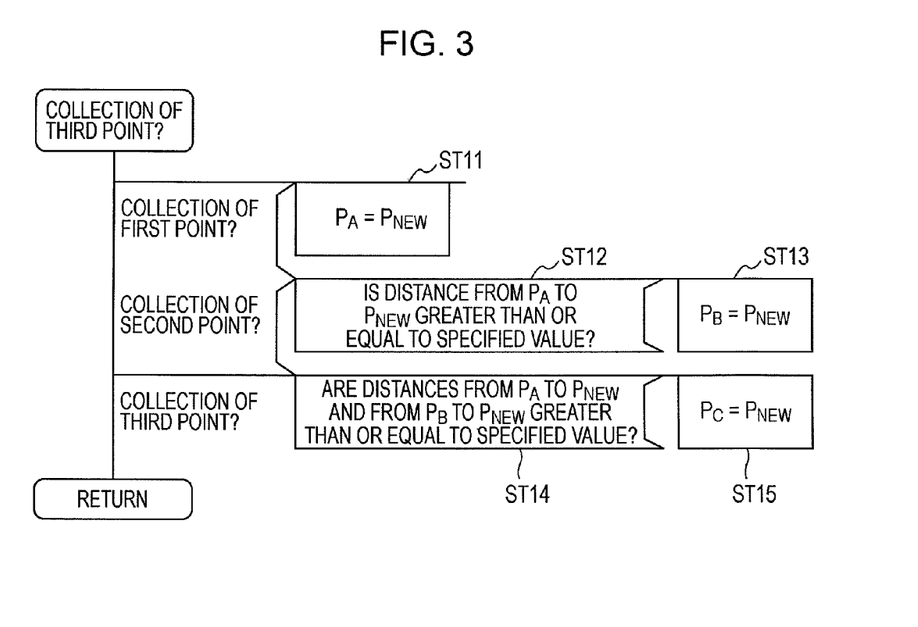
FIG. 3 is a flowchart illustrating a procedure of collecting three points.
Figure 4:
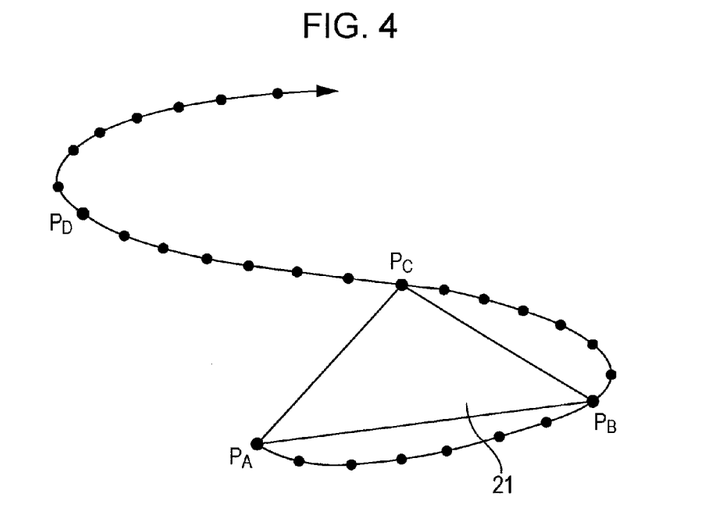
FIG. 4 is a conceptual diagram illustrating the collection of three points, the collection being performed in accordance with the procedure of FIG. 3.

FIG. 3 is a flowchart illustrating a procedure of collecting three points. FIG. 4 is a conceptual diagram illustrating the collection of three points, the collection being performed in accordance with the procedure of FIG. 3. In FIG. 3 and FIG. 4, $P_{NEW}$ indicates a given sensor output value, and $P_A$, $P_B$, and $P_C$ indicate sensor output values corresponding to collected three points. As illustrated in FIG. 3, the first point is collected and its corresponding sensor output value $P_{NEW}$ is set to $P_A$ (step ST11). Next, the second point is collected and a determination is made as to whether the distance between its corresponding sensor output value $P_{NEW}$ and the sensor output value $P_A$ is greater than or equal to a specified value (step ST12). If the distance is greater than or equal to the specified value, the sensor output value $P_{NEW}$ is set to $P_B$ (step ST13). Next, the third point is collected and determinations are made as to whether the distance between its corresponding sensor output value $P_{NEW}$ and the sensor output value $P_A$ is greater than or equal to the specified value, and whether the distance between its corresponding sensor output value $P_{NEW}$ and the sensor output value $P_B$ is greater than or equal to the specified value (step ST14). If both are greater than or equal to the specified value, the sensor output value $P_{NEW}$ is set to $P_C$ (step ST15).

In the method described above, since three points that meet the above-described condition are collected from random sensor outputs, the user who operates the electronic compass can make an azimuth calculation without having to perform a specified operation.

In practice, however, noise that occurs in an electronic circuit and variations in accuracy of AD conversion etc. may cause an error in the output of the magnetic sensor. To eliminate such an error and accurately determine the center (reference point) of a circumcircle, it is preferable to collect multiple sets of three points such as those described above, so as to average the centers of circumcircles determined from the respective sets of three points. In the averaging, a group of circumcircle centers which are present at low density and likely to have significant errors is eliminated, and only circumcircle centers which are present at high density are subjected to averaging.

Two conditions to be considered in the method of collecting multiple sets of three points are that a distance between points is greater than or equal to a predetermined value, and that a distance from a center position of a determined circumcircle to each of the points $P_A$, $P_B$, and $P_C$ is within a predetermined range.

When multiple sets of three points are collected, three points in each set are all independent and none of plotted points is shared by multiple sets. In other words, the number of points to be plotted is three times the number of sets of three points. In this case, a plurality of buffers for collecting three points are prepared, so that the sensor output is stored in each buffer in accordance with the procedure illustrated in FIG. 3. To ensure even distribution of the sensor output among buffers, when one plotted point is successfully stored in one buffer, the next plotted point is stored in the next buffer.

Figure 5:
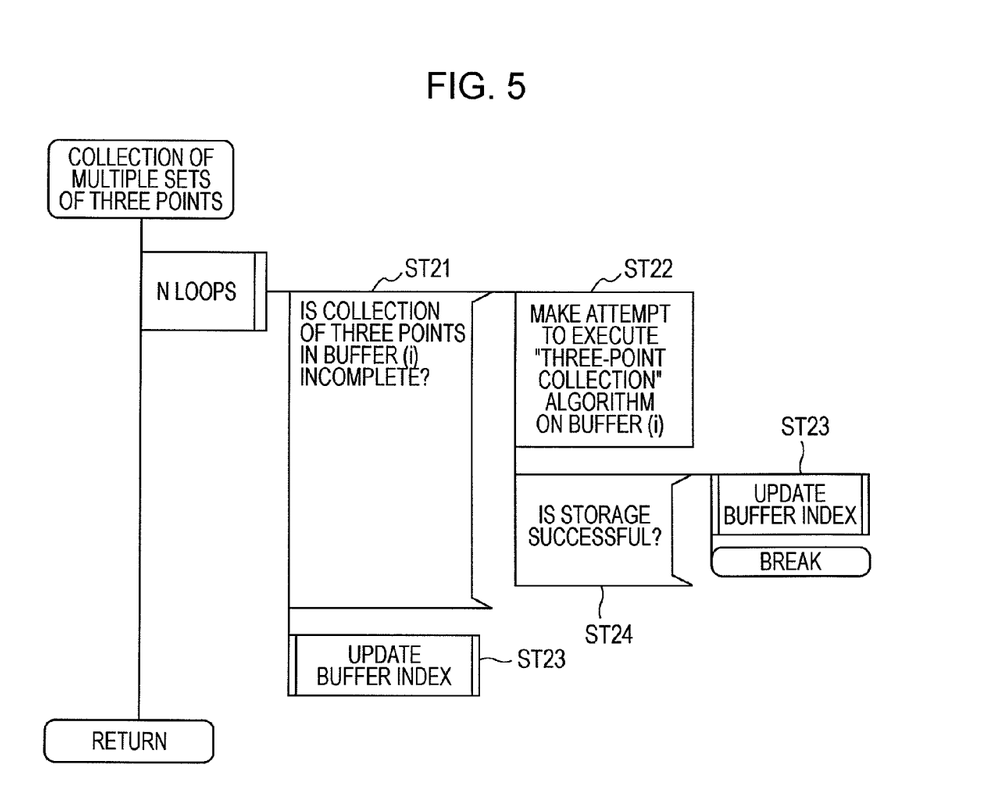
FIG. 5 is a flowchart illustrating a procedure of collecting N sets of three points in buffer (O) to buffer (N−1).
Figure 6:
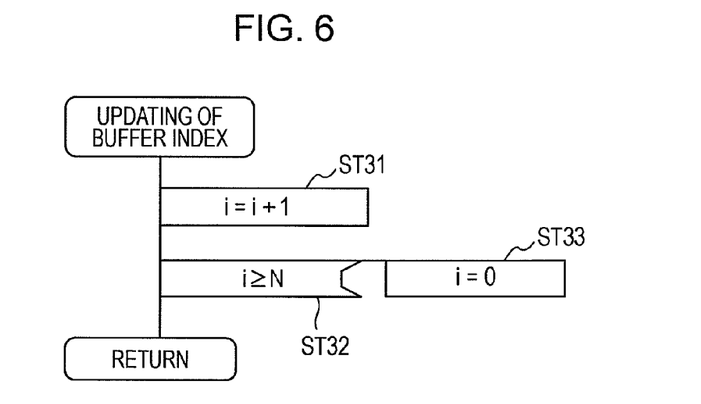
FIG. 6 is a flowchart illustrating another procedure of collecting N sets of three points in buffer (O) to buffer (N−1).

FIG. 5 and FIG. 6 are flowcharts illustrating procedures of collecting N sets of three points in buffer (0) to buffer (N−1). Before execution of the procedures, a buffer index (i) is initialized to zero.

As illustrated in FIG. 5, a determination is made as to whether collection of three points has been completed in buffer (i) (step ST21). If the collection of three points has been completed, the buffer index is updated (step ST23). If the collection of three points has not been completed, the collection of three points is performed in accordance with the procedure illustrated in FIG. 3 (step ST22). Next, a determination is made as to whether storage of sensor output in the buffer, the sensor output being obtained by the collection of three points, has been completed (step ST24). If the storage has been completed, the buffer index is updated (step ST23). This process is repeated N times.

For updating the buffer index, as illustrated in FIG. 6, a buffer number "i" is incremented by one (step ST31), and a determination is made as to whether the resulting buffer number is greater than or equal to N (step ST32). If the resulting buffer number is greater than or equal to N, the buffer number "i" is initialized (to zero) (step ST33).

Figure 7:
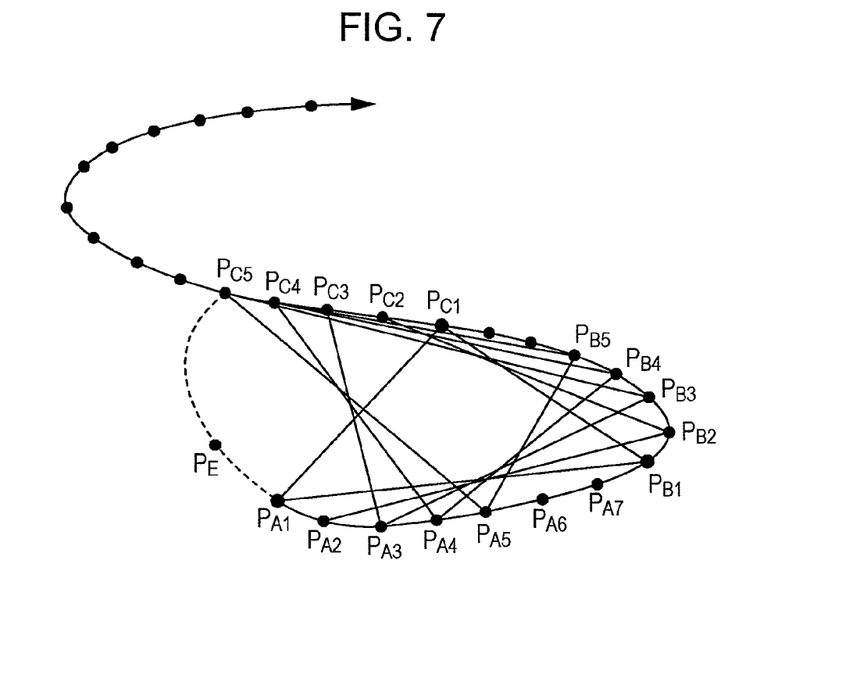
FIG. 7 is a conceptual diagram illustrating the collection of multiple sets of three points, the collection being performed in accordance with the procedures illustrated in FIG. 5 and FIG. 6.
Figure 8A:
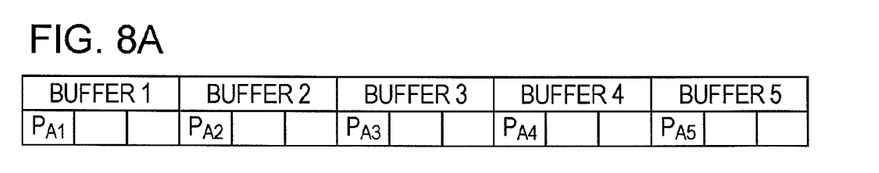
FIG. 8A to FIG. 8C illustrate how points are stored in buffers during collection of multiple sets of three points.
Figure 8B:
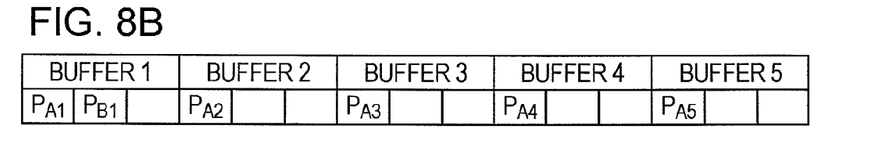
Figure 8C:
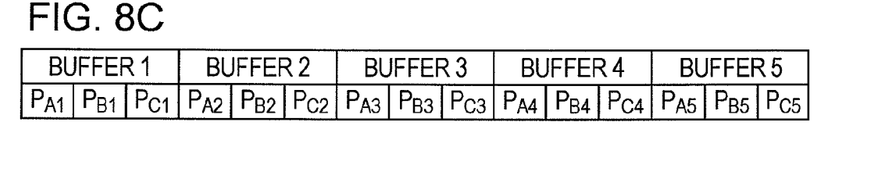

FIG. 7 is a conceptual diagram illustrating the collection of multiple sets of three points, the collection being performed in accordance with the procedures illustrated in FIG. 5 and FIG. 6. FIG. 8A to FIG. 8C illustrate how points are stored in buffers during collection of multiple sets of three points.

For example, a description will be given about the case where multiple sets of three points are collected from a group of many plotted points on the locus of sensor output, the locus being illustrated in FIG. 7. In this example, five sets of three points are collected. First, as illustrated in FIG. 8A, the first plotted points are unconditionally stored in respective buffers, each being prepared in advance for storing three points. That is, the initial five plotted points ($P_{A1}$, $P_{A2}$, $P_{A3}$, $P_{A4}$, and $P_{A5}$) are stored in the respective buffers as the first points.

In an attempt to store the subsequently collected plotted point ($P_{A6}$), a buffer for storing the plotted point ($P_{A6}$) is searched for. The search starts at a buffer that follows the buffer in which the previous plotted point is stored. Here, since the previous plotted point ($P_{A5}$) is stored in buffer 5, the attempt to store the plotted point ($P_{A6}$) starts at buffer 1. However, distances from the plotted point ($P_{A6}$) to the first points ($P_{A1}$, $P_{A2}$, $P_{A3}$, $P_{A4}$, and $P_{A5}$) in the respective buffers are short. Therefore, the plotted point ($P_{A6}$) is discarded, as it does not meet the condition described above. The next plotted point ($P_{A7}$) is also discarded for the same reason.

The subsequently collected plotted point ($P_{B1}$) is away from the first point ($P_{A1}$) in buffer 1 by a distance greater than or equal to a specified value. Therefore, as illustrated in FIG. 8B, the plotted point ($P_{B1}$) is stored as the second point in buffer 1. Likewise, as illustrated in FIG. 8C, plotted points ($P_{B2}$ to $P_{B5}$) and plotted points ($P_{C1}$ to $P_{C5}$) that meet distance conditions are sequentially stored as the second and third points in appropriate buffers.

The storage of plotted points (sensor output) in a plurality of buffers (e.g., buffers 1 to 5) is not performed in a manner in which, after a set of plotted points (e.g., three plotted points) is completely stored in one buffer, storage of plotted points in the next buffer starts. That is, the plotted points that meet the above-described conditions are stored in the buffers sequentially in the order in which they were obtained. In other words, as illustrated in FIG. 8B, while there is still a storage area left in one area, storage in another buffer is performed. As described above, obtained plotted points are sequentially stored in all the buffers on the basis of whether the above-described conditions are met. Thus, as compared to the case where collection of plotted points is performed after a set of three plotted points meeting the above-described conditions is collected, multiple sets of plotted points can be collected by performing collection a smaller number of times, and thus, calibration can be completed in a shorter time in a user-transparent manner. The above-described process of storing plotted points in a plurality of buffers is controlled by the control unit 12.

The present embodiment describes the case where the first to third points are sequentially and equally stored in a plurality of buffers. However, since each buffer has a unique condition (distance) for storing plotted points, the occupancy rate of each buffer may vary. For example, when the user does not perform a special operation for calibration, such as rotation of the equipment, a locus such as that indicated by a broken line in FIG. 7 may be followed. In this case, a point $P_E$ cannot be stored in buffer 1, but can meet a condition for storage in buffer 5. Thus, by determining whether conditions are met and sequentially storing plotted points in all buffers, data collection can be performed efficiently even when the locus of the sensor does not extend over a wide range.

Figure 9:
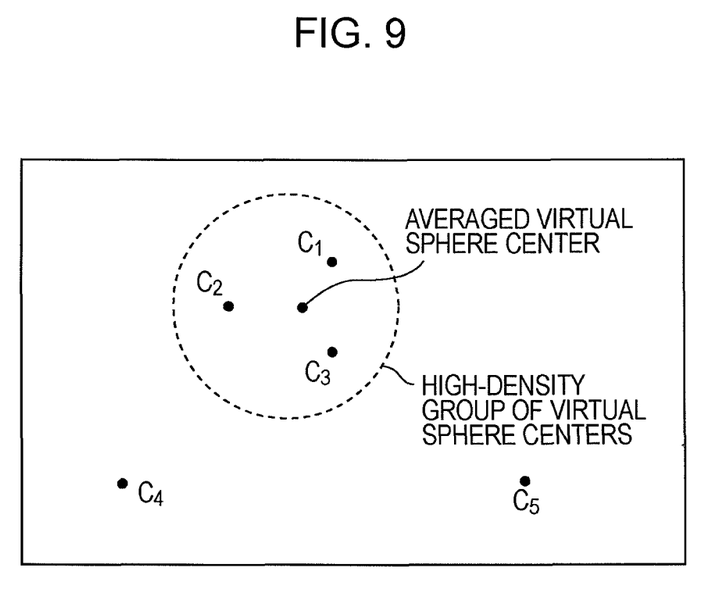
FIG. 9 illustrates density in relation to averaging of circumcircle centers.

From multiple sets of three points obtained in the manner described above, the respective centers of circumcircles are calculated and averaged to determine the original circumcircle center. For averaging the circumcircle centers, only a high-density area in a group of multiple circumcircle centers is subjected to averaging. For example, as illustrated in FIG. 9, when five sphere centers ($C_1$ to $C_5$) are calculated, three circumcircle centers in a high-density area ($C_1$ to $C_3$) are averaged, and $C_4$ and $C_5$, which are assumed to have significant noise, are eliminated. Thus, the circumcircle center can be determined from a set of only three output points with less noise. Therefore, as compared not only to the method where multiple circumcircle centers are simply averaged, but also to the method where the center is determined by performing a matrix operation directly from many output values, it is possible to reduce the effect of noise and accurately determine the circumcircle.

To determine a virtual sphere center in a high-density area, first, the sum ($L_n$) of distances from an own position ($C_n$) to other circumcircle centers (e.g., when the own position is $C_1$, the sum ($L_1$) of distances from $C_1$ to $C_2$, from $C_1$ to $C_3$, from $C_1$ to $C_4$, and from $C_1$ to $C_5$) is calculated. Then, the average of the distance sums ($L_{AVE}=(L_1+L_2+L_3+L_4+L_5)/5$) is calculated. When $L_n$ is smaller than or equal to the average of the distance sums ($L_{AVE}$), the own position ($C_n$) is regarded as a virtual sphere center in the high-density area.

Figure 10:
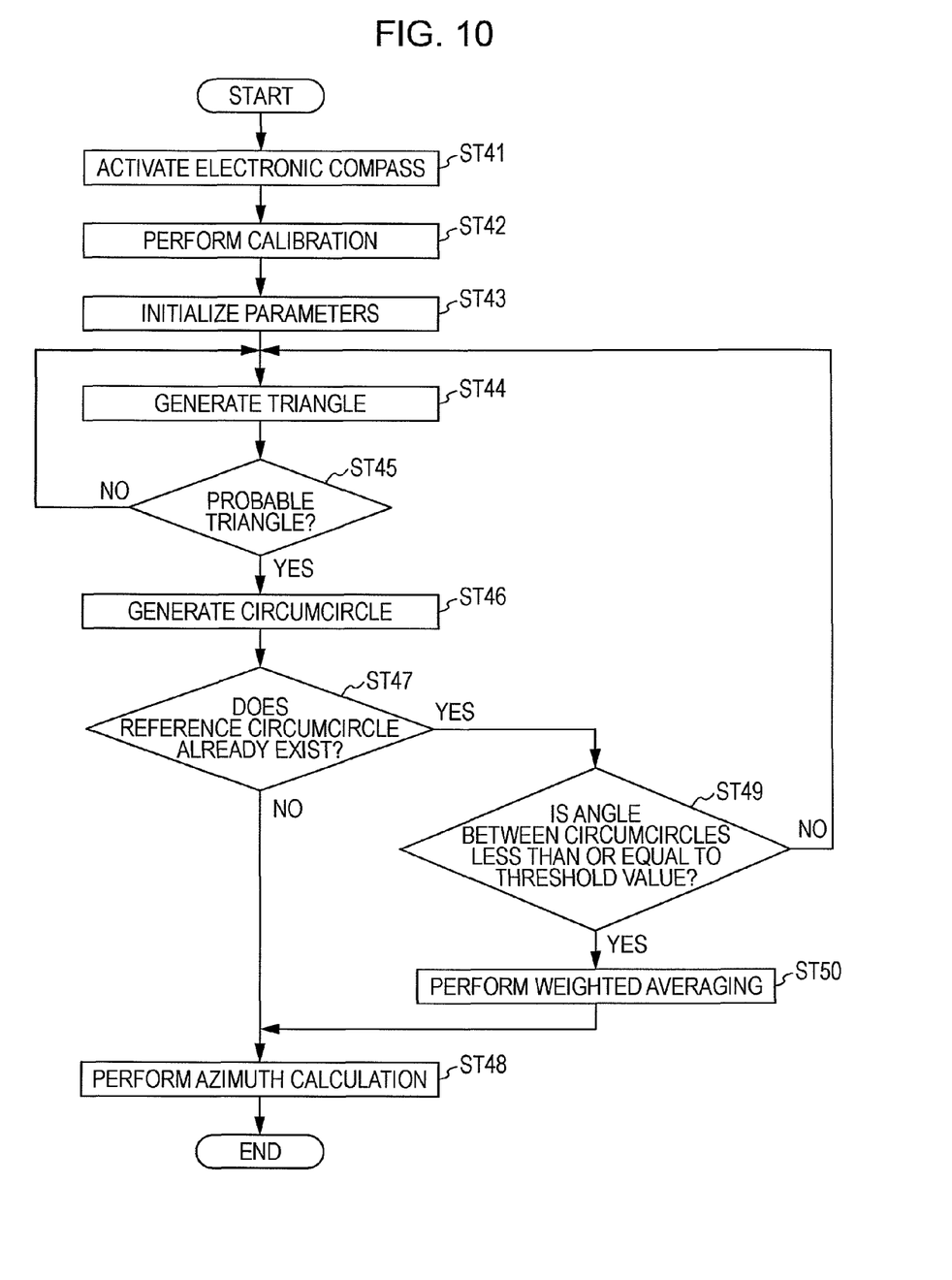
FIG. 10 is a flowchart illustrating an azimuth calculation using an azimuth calculation program according to an embodiment of the present invention.

Next, an azimuth calculation performed in the above-described electronic compass will be described. FIG. 10 is a flowchart illustrating an azimuth calculation using an azimuth calculation program according to an embodiment of the present invention.

After the electronic compass 1 is activated (step ST41), calibration is performed, and parameters necessary for an azimuth calculation are initialized (steps ST42 and ST43).

Next, the output of the magnetic sensor unit 111 in the compass module 11 is used to generate a triangle (step ST44). In this case, first, three output values are obtained from the magnetic sensor unit 111. The lengths of sides of the triangle, that is, $L_1$, $L_2$, and $L_3$, can be determined by Equations (1) below:

$$L_1 = \sqrt{\{(X_n-X_{n-1})^2+(Y_n-Y_{n-1})^2+(Z_n-Z_{n-1})^2\}}$$

$$L_2 = \sqrt{\{(X_n-X_{n+1})^2+(Y_n-Y_{n+1})^2+(Z_n-Z_{n+1})^2\}}$$

$$L_3 = \sqrt{\{(X_{n+1}-X_{n-1})^2+(Y_{n+1}-Y_{n-1})^2+(Z_{n+1}-Z_{n-1})^2\}} \quad \text{Equations (1)}$$

where the three output values (plotted points in the reference sphere P) from the magnetic sensor unit 111 are ($X_{n-1}$, $Y_{n-1}$, $Z_{n-1}$), ($X_n$, $Y_n$, $Z_n$), and ($X_{n+1}$, $Y_{n+1}$, $Z_{n+1}$).

Next, $L_1$, $L_2$, and $L_3$ determined in the above-described manner are compared to a minimum distance of the lengths of the sides of the triangle determined from the parameters initialized by calibration. Then, a determination is made as to whether the triangle is a probable one (step ST45). In other words, a determination is made as to whether $L_1$, $L_2$, and $L_3$ are all greater than the minimum distance (threshold value). If $L_1$, $L_2$, and $L_3$ are all greater than the minimum distance, it is determined that the triangle is a probable one, and a circumcircle is generated (step ST46). If any of $L_1$, $L_2$, and $L_3$ is less than or equal to the minimum distance, a triangle is formed from other plotted points (step ST44).

To generate a circumcircle, a determination is made as to whether its center coordinates ($X_c$, $Y_c$, $Z_c$) are within a predetermined range. If it is determined that the center coordinates are within the predetermined range, the determination of the circumcircle is confirmed. Then, a determination is made as to whether a circumcircle already exists, that is, a circumcircle serving as a reference is already determined and stored in the memory (step ST47). When the electronic compass 1 is activated and a circumcircle is generated for the first time, no reference circumcircle exits. In this case, the center coordinates of the generated circumcircle and output values ($X_t$, $Y_t$, $Z_t$) of the magnetic sensor unit 111, the output values being obtained at this point, are used to perform an azimuth calculation (step ST48).

Figure 11A:
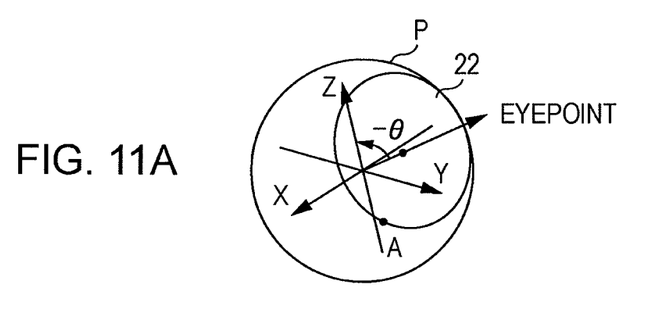
FIG. 11A to FIG. 11C illustrate an azimuth calculation.
Figure 11B:
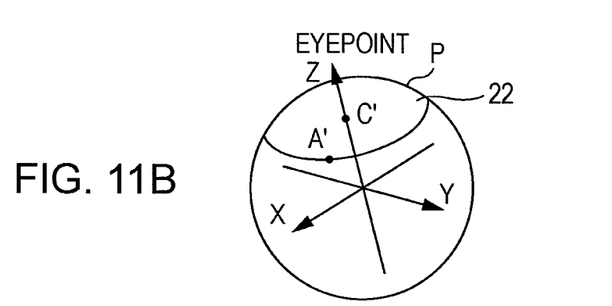

In the azimuth calculation, for the circumcircle 22 in the reference sphere P, such as that illustrated in FIG. 11A, an output value A ($A_x$, $A_y$, $A_z$) on the circumcircle 22 is first rotated about the X axis by an inclination angle ($-\theta$), as illustrated in FIG. 11B.

Coordinates ($A'_x$, $A'_y$, $A'_z$) of an output value A' obtained after the rotation can be determined by Equation (2) from the coordinates ($A_x$, $A_y$, $A_z$) obtained before the rotation and the inclination angle ($-\theta$):

$$\begin{bmatrix} A'_x \\ A'_y \\ A'_z \end{bmatrix} = \begin{bmatrix} A_x \\ A_y \\ A_z \end{bmatrix} \times \begin{bmatrix} 1 & 0 & 0 \\ 0 & \cos(-\theta) & \sin(-\theta) \\ 0 & -\sin(-\theta) & \cos(-\theta) \end{bmatrix} \quad \text{Equation (2)}$$

Figure 11C:
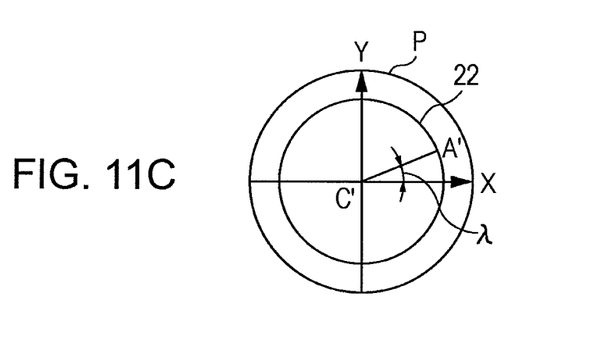

Next, an azimuth angle $\lambda$ illustrated in FIG. 11C can be determined by Equation (3) from an X component and a Y component ($A'_x$, $A'_y$) of the output value A' obtained after the rotation:

$$\text{Azimuth angle } \lambda = \tan^{-1}(A'_y/A'_x) \quad \text{Equation (3)}$$

If a reference circumcircle is already determined and stored in the memory, an angle between the already determined circumcircle and the newly determined circumcircle is calculated, and a determination is made as to whether the angle is within a predetermined range (step ST49). If the angle is within the predetermined range (i.e., less than or equal to a threshold value), the center coordinates of the newly determined circumcircle are used to calculate a weighted average of the center coordinates of the already determined circumcircle (step ST50). Then, the weighted-averaged center coordinates of the circumcircle are used to perform an azimuth calculation (step ST48).

Thus, in the electronic compass 1 according to the present invention, it is possible to perform an azimuth calculation using three output values from the magnetic sensor unit 111, and thus the azimuth of the equipment can be determined quickly. Moreover, even when the inclination direction of the equipment changes, the present program can instantaneously perform an azimuth calculation using the latest output values. Therefore, an accurate azimuth can be obtained even when the inclination direction of the equipment suddenly changes.

The present invention is not limited to the embodiments described above, and may be implemented in various ways. For example, in the embodiments described above, the compass module and the control unit of the electronic compass are configured as separate components. However, in the present invention, the compass module and the control unit of the electronic compass may be configured as a single component. Additionally, the azimuth calculation method described in the above embodiments is merely an example, and other modified azimuth calculation methods based on the three points that constitute three corners of the triangle may be used in the present invention. Various other modifications may be made without departing from the scope of the present invention. Additionally, the azimuth calculation method described in the above embodiments is merely an example, and other azimuth calculation methods may be used in the present invention. Various other modifications may be made without departing from the scope of the present invention.

What is claimed is:

1. A method of determining an azimuth in an electronic compass, wherein the electronic compass performs functions, the electronic compass includes a compass module and a control unit, the compass module including a magnetic sensor unit, the control unit includes an azimuth calculation program and a calibration program, the method comprising:

using a control unit to perform an azimuth calculation utilizing output from the magnetic sensor unit, the magnetic sensor unit including magnetic sensor elements corresponding to at least three axes for magnetic detection, wherein the magnetic sensor unit outputs three dimensional output corresponding to X, Y, Z axes, wherein the azimuth calculation comprises:

selecting three points selected from random outputs of the magnetic sensor, wherein the three points constitute three corners of a triangle in a three dimensional space;

determining a circumcircle which passes through the three points, which are the three corners of the triangle; and performing the azimuth calculation using a center coordinate of the circumcircle and an output value of the magnetic sensor, wherein the azimuth calculation is performed by rotating an output value A (Ax, Ay, Az) through coordinate rotation about X axis, the center of the circumcircle is moved on the Z axis by the rotation, the rotation renders the output value A (Ax, Ay, Az) to A' (A'x, A'y, A'z), wherein azimuth angle is obtained from the equation $\lambda = \tan^{-1}(A'y/A'x)$, wherein the azimuth calculation program determines the azimuth calculation using output of the magnetic sensor elements, and the calibration program determines a reference point of output of each magnetic sensor elements using output of the magnetic sensor unit.

2. The method according to claim 1, wherein when an angle between a plane containing an already determined circumcircle and another plane containing a newly determined circumcircle is within a predetermined range, center coordinates of the respective already determined circumcircles are used to perform the azimuth calculation.

3. The method according to claim 1, wherein when an angle between a plane containing an already determined circumcircle and another plane containing a newly determined circumcircle is within a predetermined range, center coordinates of the respective newly determined circumcircles are used to obtain a weighted average of center coordinates of the already determined circumcircle.

4. The method according to claim 1, wherein the circumcircle is determined by collecting multiple sets of three output values from the magnetic sensor, and averaging centers of virtual circumcircles determined from the respective collected sets of the three output values.

5. The method according to claim 1, comprising utilizing a plurality of buffers for storing the three output values which are selected from the random outputs of the magnetic sensor so that distances between two of the three output values are equal or greater than a specified value.

* * * * *